(12) United States Patent
Ko et al.

(10) Patent No.: US 7,915,109 B2
(45) Date of Patent: Mar. 29, 2011

(54) SEMICONDUCTOR PROBE STRUCTURE USING IMPACT-IONIZATION METAL OXIDE SEMICONDUCTOR DEVICE, INFORMATION STORING DEVICE THEREWITH AND MANUFACTURING METHOD THEREOF

(75) Inventors: Hyoung Soo Ko, Seoul (KR); Byung Gook Park, Seoul (KR); Seung Bum Hong, Seongnam-si (KR); Chul Min Park, Yongin-si (KR); Woo Young Choi, Yongin-si (KR); Jong Pil Kim, Yongin-si (KR); Jae Young Song, Yongin-si (KR); Sang Wan Kim, Yongin-si (KR)

(73) Assignees: Samsung Electronics Co., Ltd., Suwon-si (KR); Seoul National University Industry Foundation, Seoul (KR)

( * ) Notice: Subject to any disclaimer, the term of this patent is extended or adjusted under 35 U.S.C. 154(b) by 640 days.

(21) Appl. No.: 11/957,575

(22) Filed: Dec. 17, 2007

(65) Prior Publication Data

US 2008/0169465 A1    Jul. 17, 2008

(30) Foreign Application Priority Data

Jan. 16, 2007    (KR) .................... 10-2007-0004973

(51) Int. Cl.
*H01L 21/336* (2006.01)
*H01L 21/8234* (2006.01)

(52) U.S. Cl. .......................................... 438/197; 438/18
(58) Field of Classification Search .................. 438/18, 438/197
See application file for complete search history.

(56) References Cited

U.S. PATENT DOCUMENTS

| 2008/0200001 A1* | 8/2008 | Clavelier et al. ............... 438/305 |
| 2008/0220556 A1* | 9/2008 | Ko et al. .......................... 438/52 |
| 2009/0026553 A1* | 1/2009 | Bhuwalka et al. ............. 257/402 |

* cited by examiner

*Primary Examiner* — N Drew Richards
*Assistant Examiner* — Grant S Withers
(74) *Attorney, Agent, or Firm* — Sughrue Mion, PLLC

(57) ABSTRACT

A method of manufacturing a probe includes: forming a first slant face of the probe through an anisotropic etching process using a first etching mask pattern formed on a silicon substrate; forming a first semiconductor electrode region; forming a second etching mask pattern in an opposite direction of the first etching mask pattern on the silicon substrate; forming a spacer layer on a side wall of the second etching mask pattern; forming a second slant face of the probe; forming a second semiconductor electrode region; forming a silicon oxide layer pattern on the resulting silicon substrate; forming spacer layers on both side walls of the silicon oxide layer pattern; and etching the silicon substrate to a predetermined depth.

9 Claims, 12 Drawing Sheets

SEMICONDUCTOR PROBE STRUCTURE USING IMPACT-IONIZATION METAL OXIDE SEMICONDUCTOR DEVICE, INFORMATION STORING DEVICE THEREWITH AND MANUFACTURING METHOD THEREOF

CROSS-REFERENCE TO RELATED APPLICATIONS

This application claims priority from Korean Patent Application No. 10-2007-0004973, filed on Jan. 16, 2007 in the Korean Intellectual Property Office, the disclosure of which is incorporated herein by reference.

BACKGROUND OF THE INVENTION

1. Field of the Invention

Apparatuses and methods consistent with the present invention relate to a semiconductor probe structure using an impact-ionization metal oxide semiconductor device (I-MOS device), an information storing device therewith and a manufacturing method thereof, and more particularly to the semiconductor probe structure using I-MOS device, in which sensitivity of the probe can be improved by applying a negative voltage to a source portion to regulate band energy, the information storing device including the semiconductor probe structure and the manufacturing method of the semiconductor probe structure.

2. Description of the Prior Art

In the recent trend of a complementary metal oxide semiconductor, there continues to be a reduction in device size in order to improve a degree of integration and performance. Such reduction in device size accompanies OFF current increase. Also, in the case of a typical enhancement mode or depletion mode semiconductor device, it is difficult to make the sub-threshold slope lower than the theoretical limit, i.e. thermal voltage (KT/q). For these reasons, there is a problem in that it is difficult to obtain a high ON/OFF current ratio under a given operation voltage.

The probe currently being studied and manufactured has a channel portion with a length of about 30 nm, and thus it corresponds to a short channel semiconductor device. Even in the case of a resistive probe it was possible to ascertain that there existed a considerable OFF current due to the short channel effect. Particularly, in the case of the resistive probe, it has been found that since the resistive probe is based on the depletion mode semiconductor device, a large OFF current flows as illustrated in FIG. 1.

As mentioned before, the large OFF current causes the ON/OFF current ratio to decrease and thus a higher performance cannot be expected with respect to the sensitivity of the device. Further, as illustrated in FIG. 1, the sub-threshold slope is higher, thus making the boundary of the ON/OFF uncertain. These problems do not only incur a cause of malfunction when sensing charge in ferroelectric material, but also induce degradation of the sensitivity.

These problems should be solved in order to develop a probe with a higher performance level. However, in the conventional probe using the depletion mode or the enhancement mode semiconductor device, it is difficult to solve the problem such as the increasing OFF current due to the short channel effect. Further, there is the basic limit in that the sub-threshold slope cannot be lowered below the thermal voltage.

SUMMARY OF THE INVENTION

Accordingly, the present invention has been made to solve the above-mentioned problems occurring in the prior art, and the present invention provides a semiconductor probe structure using an impact-ionization metal oxide semiconductor device, an information storing device therewith and a manufacturing method thereof, wherein the novel probe structure is developed using the impact-ionization metal oxide semiconductor device and thus the sensitivity limit of a conventional resistive probe can be significantly improved.

Also, the present invention provides the semiconductor probe structure using the impact-ionization metal oxide semiconductor device, the information storing device therewith and the manufacturing method thereof, wherein it is possible to improve an ON/OFF current property and a sensitivity property.

Also, the present invention provides the semiconductor probe structure using the impact-ionization metal oxide semiconductor device, the information storing device therewith and the manufacturing method thereof, wherein an amount of electrical charge to which a sensing operation refers may be readily controlled by applying a negative voltage to a source portion to thereby control a band energy of the source.

In accordance with an exemplary embodiment of the present invention, there is provided a manufacturing method of the semiconductor probe structure using the impact-ionization metal oxide semiconductor device, the method including forming a first slant face of the semiconductor probe structure through an anisotropic etching process using a first etching mask pattern formed on a silicon substrate; forming a first semiconductor electrode region by doping impurities on an exposed portion of the silicon substrate and removing the first etching mask pattern; forming a second etching mask pattern in an opposite direction of the first etching mask pattern on the silicon substrate; forming a spacer layer on a side wall of the second etching mask pattern; forming a second slant face of the probe by anisotropically etching the exposed portion of the silicon substrate and thereafter removing the spacer layer; forming a second semiconductor electrode region by doping the impurities on the exposed portion of the silicon substrate and thereafter removing the second etching mask pattern; forming a silicon oxide layer pattern on the resulting silicon substrate having the second semiconductor electrode region; forming spacer layers on both side walls of the silicon oxide layer pattern; and etching the silicon substrate to a predetermined depth by photolithographic and etching processes using the spacer layer and removing the spacer layer.

According to another aspect of the present invention, the first semiconductor electrode region is formed on the first slant face of the probe in whole, while the second semiconductor electrode region is formed on the second slant face of the probe to expose an upper portion of the second slant face.

According to another aspect of the present invention, the first semiconductor electrode region is formed on the first slant face of the probe to expose an upper portion of the first slant face, while the second semiconductor electrode region is formed on the second slant face of the probe in whole.

According to another aspect of the present invention, the first semiconductor electrode region is a source terminal and the second semiconductor electrode region is a drain terminal.

According to another aspect of the present invention, a ground voltage is applied to the silicon substrate, a positive voltage is applied to the drain terminal and a gate terminal and a negative voltage is applied to a source terminal.

Also, the first semiconductor electrode region may serve as a drain electrode and the second semiconductor electrode region may serve as a source electrode.

According to another aspect of the present invention, that a ground voltage is applied to the silicon substrate, a positive voltage is applied to the drain terminal and a gate terminal and a negative voltage is applied to a source terminal.

Also, forming the silicon oxide layer pattern includes the sub-steps of: depositing a third etching mask, a fourth etching mask and a photo-resist layer on the silicon substrate in sequence; patterning the photo-resist layer and thereafter etching the fourth etching mask layer using the photolithographic and the etching processes; removing the photo-resist layer and then forming a second spacer layer on a side wall of the fourth etching mask layer; removing the fourth etching mask layer and thereafter etching the third etching mask layer using the second spacer layer; removing the second spacer layer and forming a pattern of the silicon oxide layer.

Also, the spacer layer is formed by coating the third etching mask layer with an HSQ (hydrogen silsequioxane) solution.

In accordance with another aspect of the present invention, there is provided a semiconductor probe structure using an impact-ionization metal oxide semiconductor device in accordance with the present invention, the semiconductor probe structure including: a body portion formed of a silicon substrate in a pyramid shape and doped with one of a first impurity and a second impurity; a sensing zone located at a peak of the body portion; a first semiconductor electrode region formed on a first slant face of the body portion in whole and doped with the first impurity at a high concentration; a second semiconductor electrode region formed on a second slant face of the body portion to expose the sensing zone and a part of the slant face connected to the sensing zone and doped with the second impurity at a high concentration; and an ionization impact region located at the exposed part of the second slant face of the body portion.

According to another aspect of the present invention, the first semiconductor electrode region may serve as a source terminal, and the second semiconductor electrode region may serve as a drain terminal.

According to another aspect of the present invention, it is exemplary that a ground voltage is applied to the silicon substrate, a positive voltage is applied to the drain terminal and a gate terminal, and a negative voltage is applied to the source terminal.

According to another aspect of the present invention, the first semiconductor electrode region may serve as a drain electrode, while the second electrode region may serve as a source electrode.

According to another aspect of the present invention, a ground voltage is applied to the silicon substrate, a positive voltage is applied to the drain terminal and a gate terminal, and a negative voltage is applied to the source terminal.

In accordance with another exemplary embodiment of the present invention, there is provided an information storing device with a semiconductor probe structure using an impact-ionization metal oxide semiconductor device, the information storing device with semiconductor probe structure including: a tip having a body portion formed of a silicon substrate in a pyramid shape and doped with one of a first impurity and a second impurity, a sensing zone located at a peak of the body portion, a first semiconductor electrode region formed on a first slant face of the body portion in whole and doped with the first impurity at a high concentration, a second semiconductor electrode region formed on a second slant face of the body portion to expose the sensing zone and a part of the slant face connected to the sensing zone and doped with the second impurity at a high concentration, and an impact-ionization region located at the exposed part of the second slant face of the body portion; and a semiconductor probe having a cantilever located under the tip, wherein a ground voltage is applied to the silicon substrate, a positive voltage is applied to drain and gate terminals, and a negative voltage is applied to the source terminal of the first and the second semiconductor electrode regions.

According to another aspect of the present invention, if the first semiconductor electrode region is a source terminal; and the second semiconductor electrode region is a drain terminal, then the first impurity comprises boron and the second impurity comprises arsenic or phosphorous.

According to another aspect of the present invention, if the first semiconductor electrode region is a drain electrode; and the second electrode region is a source electrode, then the first impurity comprises arsenic or phosphorous and the second impurity comprises boron.

Accordingly, in the present invention, it is not only possible to improve the ON/Off current property and the sensitivity property, but also possible to readily adjust amount of charges serving as a sense-reference by controlling the band energy of the source with the application of the negative voltage to the source.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EXEMPLARY EMBODIMENTS

Figure 1:
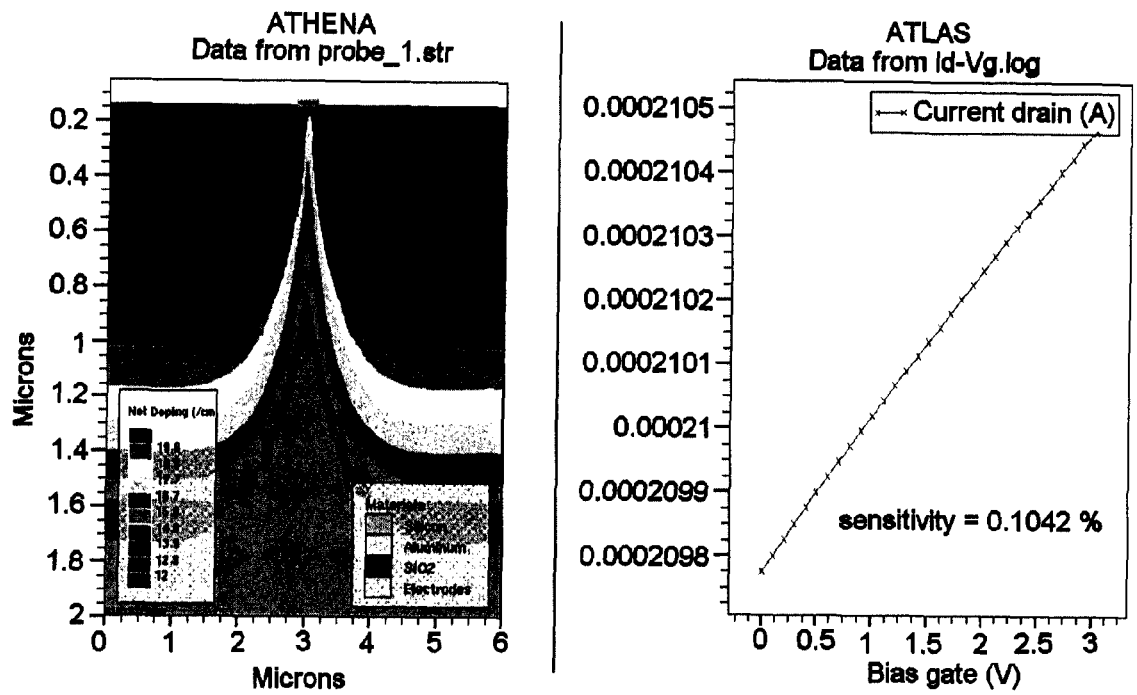
FIG. 1 is a diagram illustrating the sensitivity of a resistive probe according to the prior art.

Hereinafter, an exemplary embodiment of the present invention will be described with reference to the accompanying drawings. In the following description and drawings, the same reference numerals are used to designate the same or similar components, and so repetition of the description on the same or similar components will be omitted.

Figure 2:
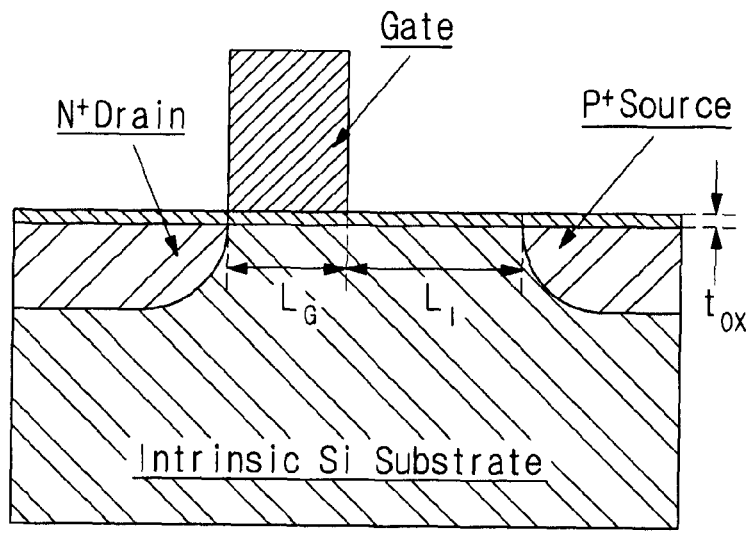
FIG. 2 is a cross-sectional view of a structure of an N-channel impact-ionization metal oxide semiconductor device according to the prior art.

FIG. 2 illustrates a basic configuration of an impact-ionization metal oxide semiconductor device used in the present invention. FIG. 2 illustrates an N-channel impact-ionization metal oxide semiconductor device, which includes a N+ doped drain region, P+ doped source region, a channel with a length of LG and a impact-ionization region with a length of LI.

Figure 3:
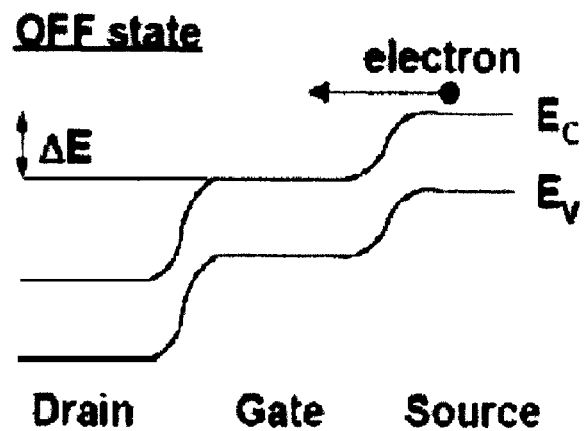
FIGS. 3 and 4 are diagrams respectively illustrating the energy band in OFF and ON states of the impact-ionization metal oxide semiconductor device according to the prior art.
Figure 4:
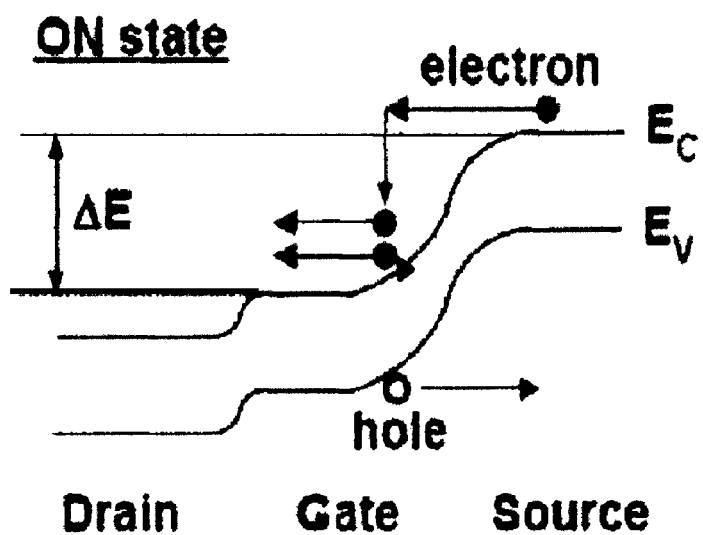

A basic operation may be summarized as follows. An energy band of the impact-ionization metal oxide semiconductor device in an OFF state is illustrated in FIG. 3. The energy band of the impact-ionization metal oxide semiconductor device in an ON state is illustrated in FIG. 4. When the positive voltage is applied to the gate region, the energy band therein decreases. As electrons serving as a minority carrier supplied from the source region enter into an impact-ionization region, they will have kinetic energy, amount of which correspond to an energy band gap. Electrons with larger kinetic energy will form electron-hole pairs and cause avalanche breakdown to occur. Many electrons generated by the avalanche breakdown flow to the drain region and thus electric current flows thereby.

In order to cause the avalanche breakdown to occur, there should be a sufficient band energy gap between an intrinsic semiconductor corresponding to the impact-ionization region and the source region doped with P+. When in the OFF state, the energy band gap is not sufficient, so that the avalanche breakdown does not occur and the electric current cannot flow. A very high voltage should be applied to the gate for causing the avalanche breakdown to occur, but such a high voltage may adversely affect the device.

Figure 5:
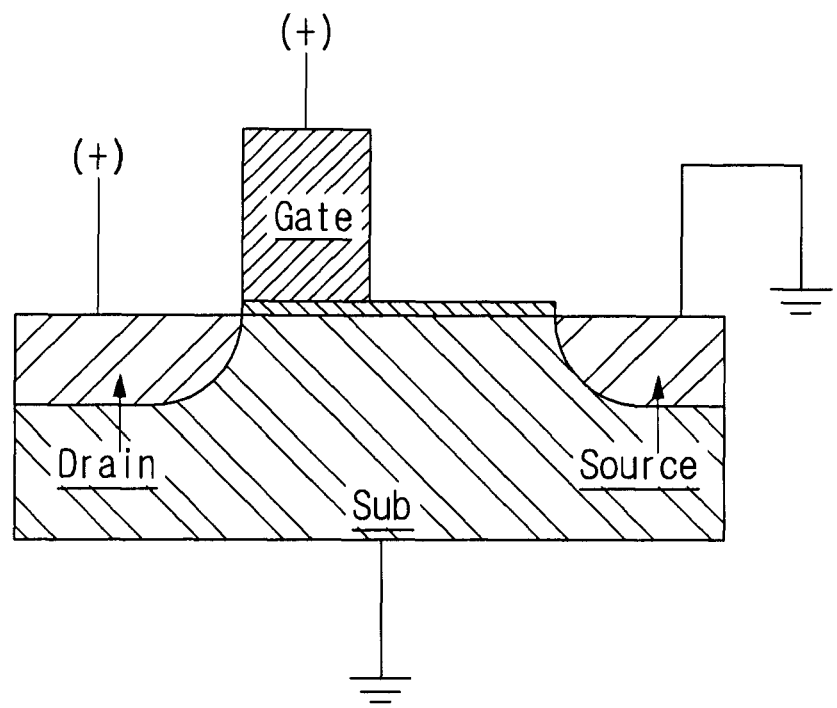
FIG. 5 is cross-sectional view illustrating a voltage application in the impact-ionization metal oxide semiconductor device according to the prior art.

Accordingly, it is necessary to provide a novel method for obtaining the energy band gap sufficient to cause the avalanche breakdown occur by means of voltage application other than the conventional one illustrated in FIG. 5, while imposing little load on the device.

Figure 6:
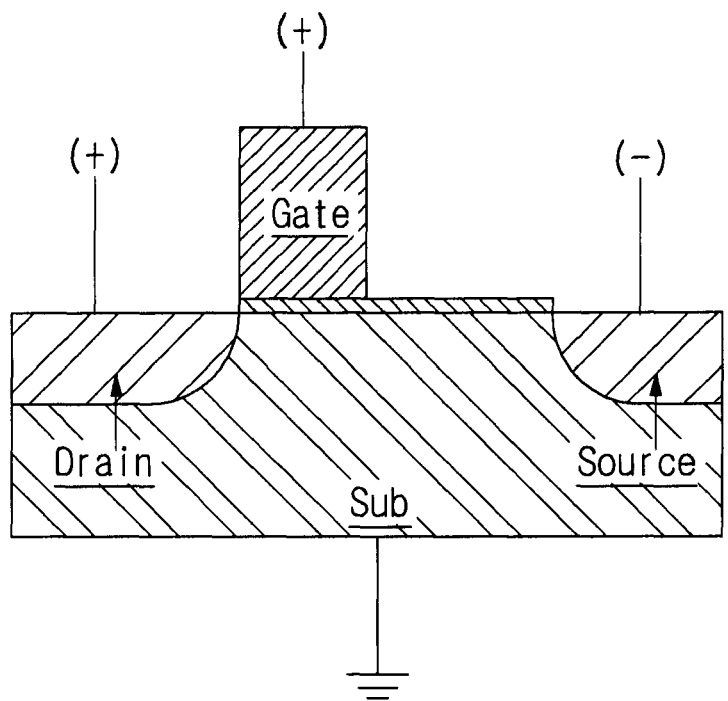
FIG. 6 is cross-sectional view illustrating a voltage application in the impact-ionization metal oxide semiconductor device according to an exemplary embodiment of the present invention.

FIG. 6 illustrates an application of a negative (−) voltage to the source portion of the impact-ionization metal oxide semiconductor. When the negative (−) voltage is applied to the gate, the band energy of the source portion increases. Also, even in a state of no voltage application to the source, the energy band gap between the source and the impact-ionization region increases. Accordingly, the positive voltage to be applied to the gate for the avalanche breakdown may be reduced compared to the case illustrated in FIG. 5 and other problems due to the high voltage application may be avoided. In addition, with use of the voltage application to the source, an amount of electric charges serving as reference for measurement may be optionally determined. The amount of the electric charges, which serves as a reference for determining ON/OFF state, can be adjusted by adjusting the negative (−) voltage applied to the source, and thus convenience in use may be expected when it is used as a probe.

Figure 7:
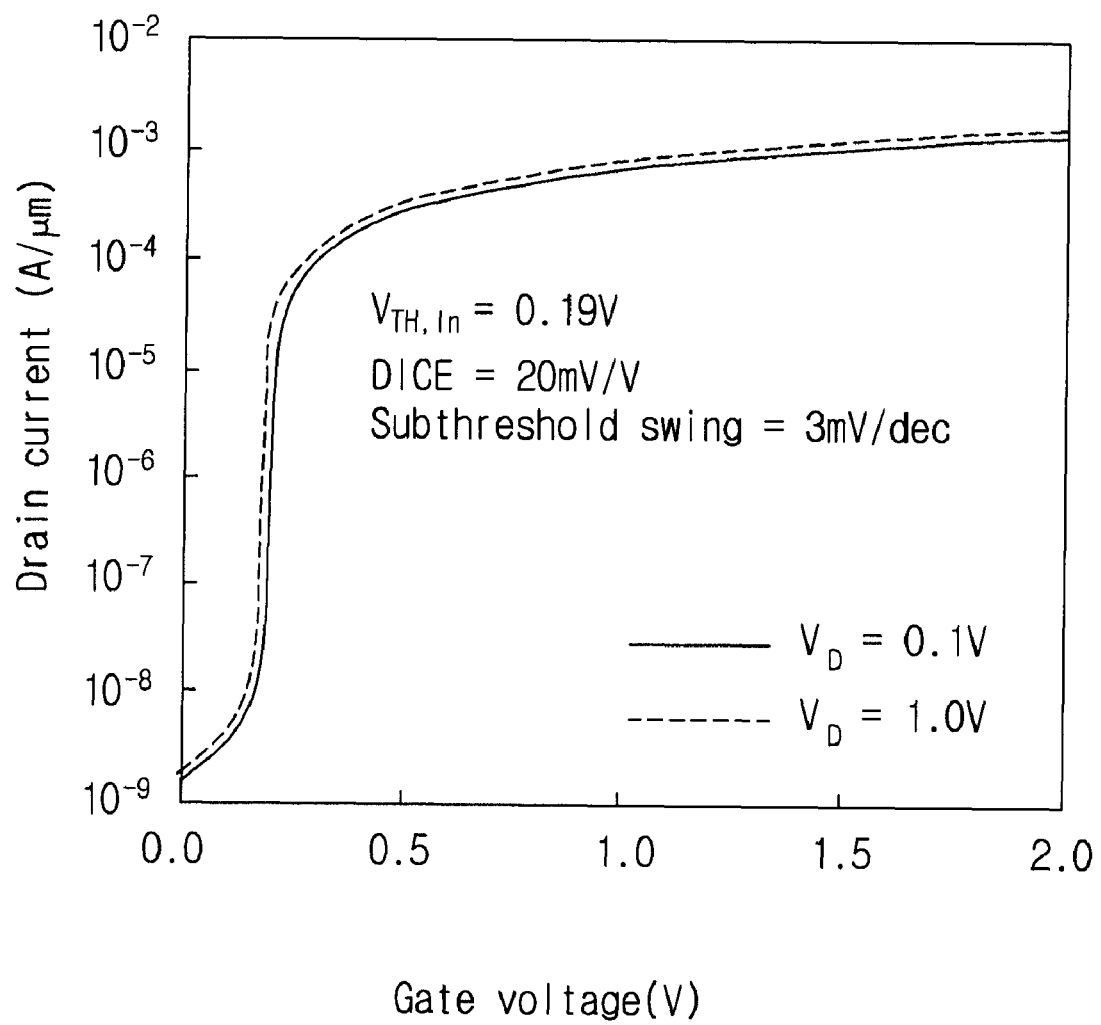
FIGS. 7 and 8 are graphs illustrating a transmit property and an output property, respectively, obtained from the trial experiment using the impact-ionization metal oxide semiconductor device according to an exemplary embodiment of the present invention.
Figure 8:
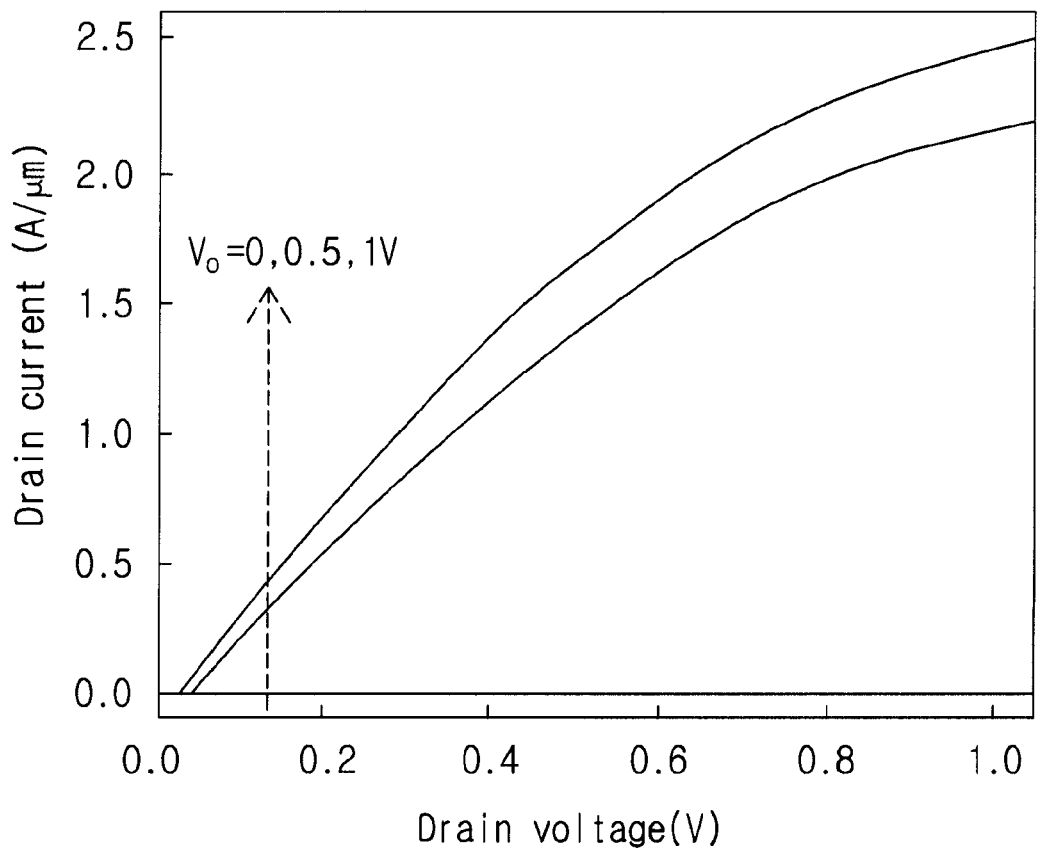

FIGS. 7 and 8 illustrate a transmit property and an output property of the impact-ionization metal oxide semiconductor device, respectively, obtained from the trial experiment. As may be appreciated from FIGS. 7 and 8, since the impact-ionization metal oxide semiconductor device uses the electrons generated from the avalanche breakdown of the minority carrier as an electric current source, it is free from the restriction in that the sub threshold slope is the thermal voltage (kT/g), which is different from the conventional enhancement mode semiconductor device and the conventional depletion mode semiconductor device. Also, the current in the OFF state is very low. Thus, the ON/OFF property may become distinctive and the ON/OFF current ratio may be obtained with the sufficient size. Accordingly, a higher sensitivity may be ensured if the impact-ionization oxide metal semiconductor device is used as the probe.

In other words, the above-described problems occurring in the conventional resistive probe, such as the degradation of the device sensitivity due to the high current in the OFF state and the increase of the sub-threshold slope can be significantly improved using the probe made from the impact-ionization oxide metal semiconductor device.

Next, a manufacturing method of the probe using the impact-ionization oxide metal semiconductor device will be described with reference to the drawings.

FIGS. 9*a*-9*j* are schematic views of processes illustrating the manufacturing method of the probe using the impact-ionization oxide metal semiconductor device according to an exemplary embodiment of the present invention. FIGS. 10*a*-10*g* are sectional views of processes for forming a pyramid-shaped probe end in a widthwise direction.

Figure 9A:
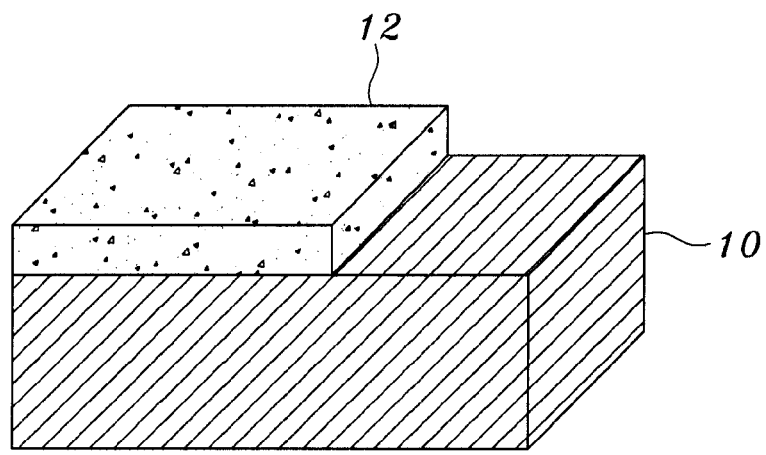
FIGS. 9a-9j are schematic views of processes illustrating a manufacturing method of a probe using the impact-ionization oxide metal semiconductor device according to an exemplary embodiment of the present invention.

First, as illustrated in FIG. 9*a*, an etching mask layer (12) is formed by depositing a nitride layer for the etching mask on a silicon substrate 10 and then patterning the nitride layer.

Figure 9B:
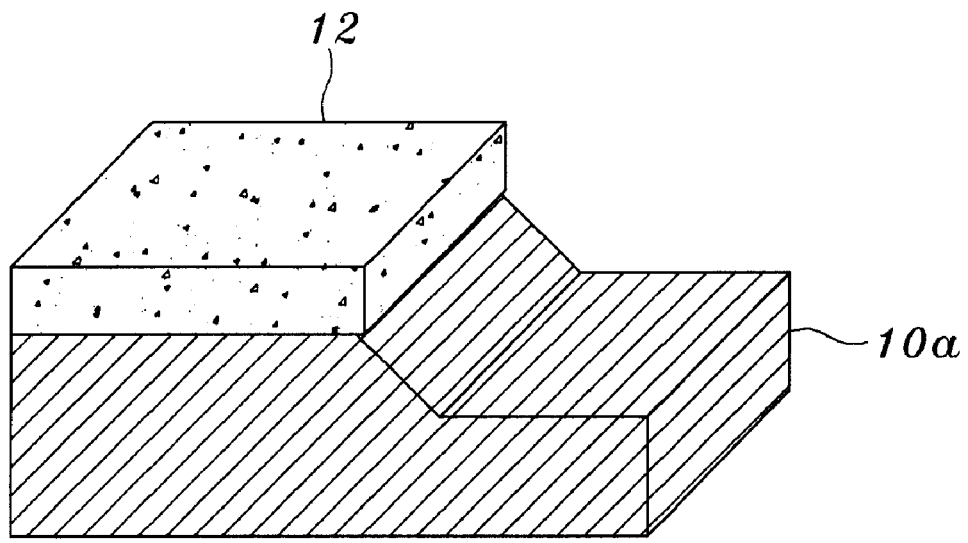

Next, as illustrated in FIG. 9*b*, a first slant face is formed by anisotropically etching the substrate 10 using the etching mask layer 12 in either a wet or a dry etching process.

Figure 9C:
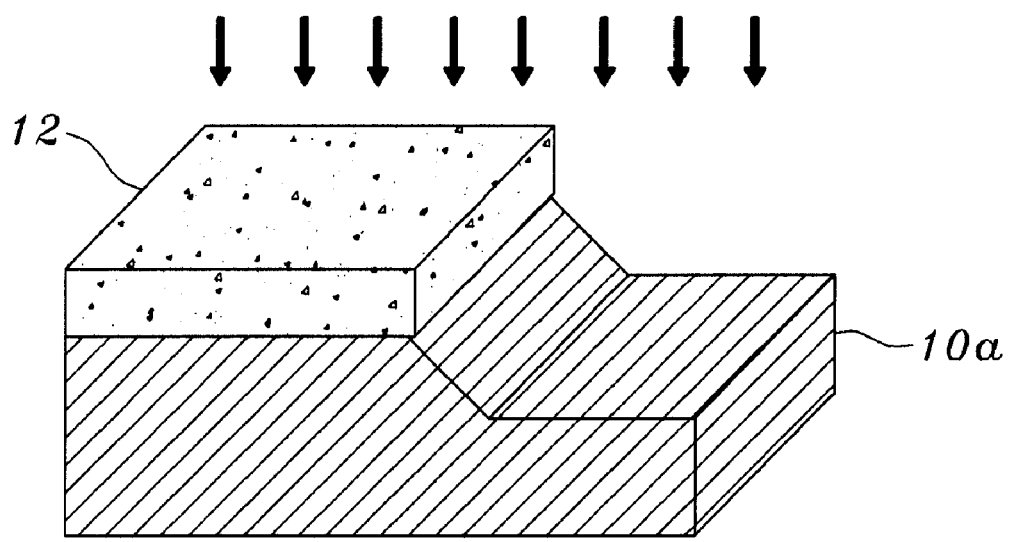

Next, as shown in FIG. 9*c*, a substrate 10*a* with one exposed portion is doped with a first impurity to thereby form P+ region or N+ region in order to form a first semiconductor electrode region (a source region or a drain region).

Here, if the first semiconductor electrode region is the source region, boron is used as the first impurity for performing a doping process to thereby form the P+ region. On the other hand, if the first semiconductor electrode region is the drain region, arsenic or phosphorous is used as the first impurity for performing the doping process to thereby form the N+ region.

Figure 9D:
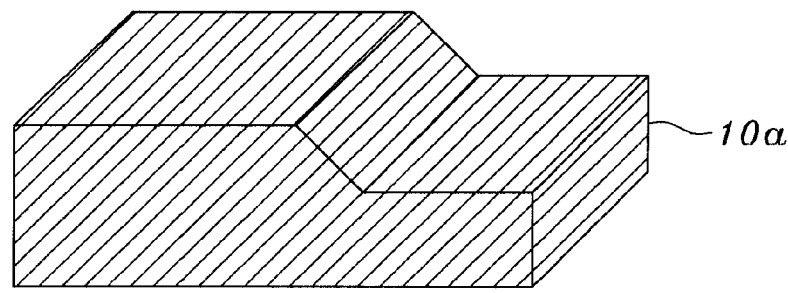

Thereafter, as illustrated in FIG. 9*d*, the etching mask layer 12 is removed.

Figure 9E:
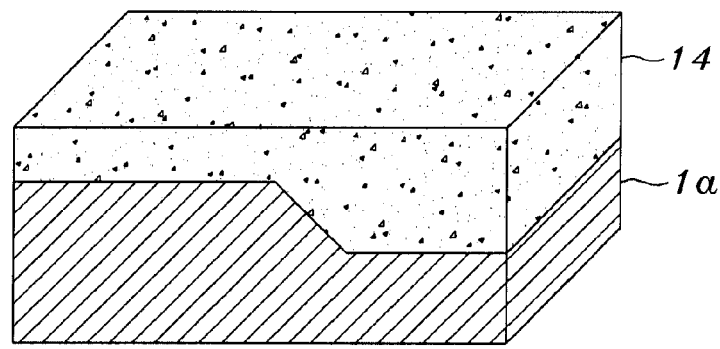

Next, as illustrated in FIG. 9*e*, nitride is deposited on the substrate 10*a* so as to form an etching mask and then a flattening process is carried out.

Figure 9F:
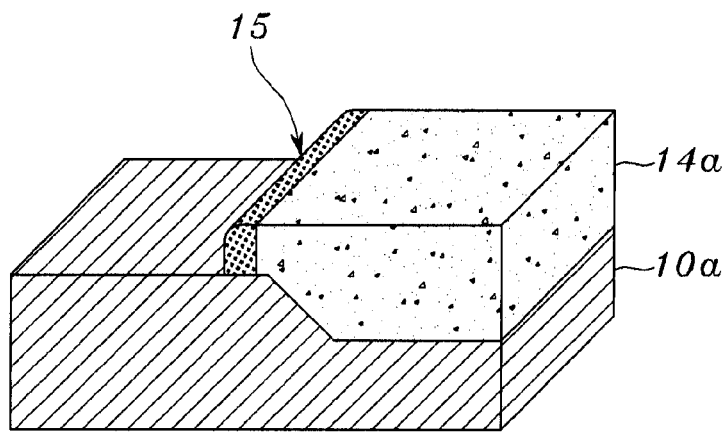

Thereafter, as illustrated in FIG. 9*f*, the etching mask layer 14*a* is formed by a patterning process in order to have the etching mask layer 14*a* extended in an opposite direction of the etching mask layer 12 illustrated in FIG. 9*a*. Then, a side wall 15 of a silicon oxide layer is formed at one side of the etching mask 14*a*, which corresponds to an upper portion of the probe.

Figure 9G:
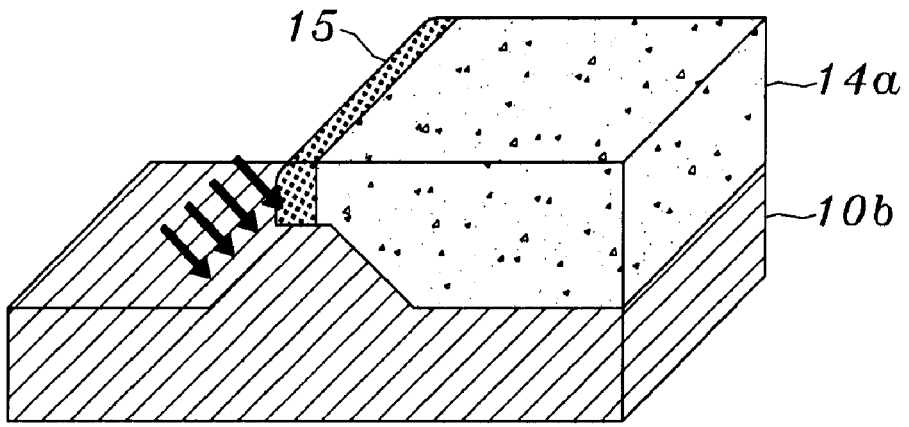

Thereafter, as illustrated in FIG. 9*g*, a second slant face of the probe is formed by anisotropically etching the substrate 10*b* in the dry or the wet etching process using the etching mask layer 13 and the side wall 15.

Figure 9H:
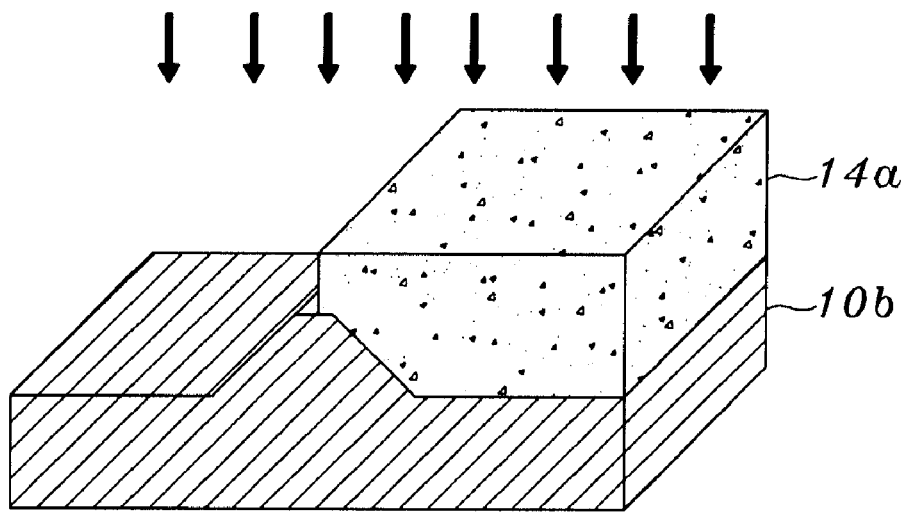

Next, as illustrated in FIG. 9*h*, the side wall 15 is removed and then the substrate 10*b* with the other exposed portion is doped with a second impurity to thereby form P+ region or N+ region in order to form a second semiconductor electrode region (a source or a drain region).

Here, if the second semiconductor electrode region is the source region, boron is used as the second impurity for performing a doping process to thereby form the P+ region. On the other hand, if the second semiconductor electrode region is the drain region, arsenic or phosphorous is used as the second impurity for performing the doping process to thereby form the N+ region.

Figure 9I:
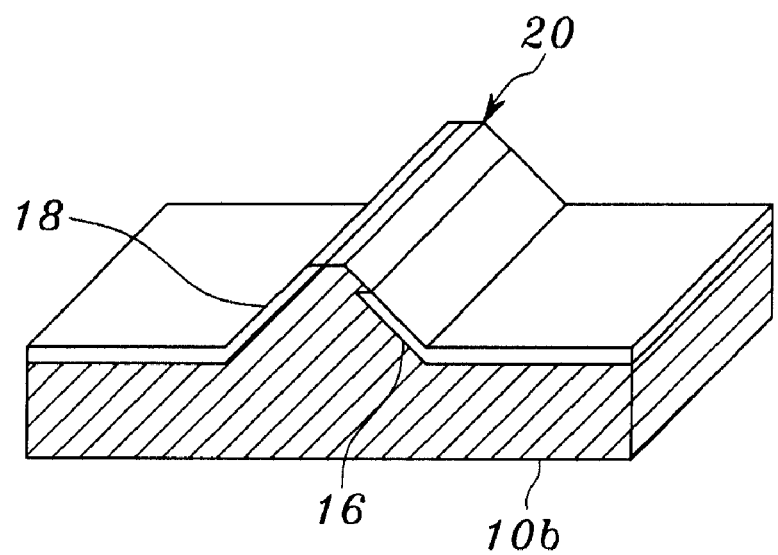

Thereafter, as illustrated in FIG. 9*i*, the etching mask layer 14*a* made from the nitride is removed. Here, the reference numeral 16 indicates the first semiconductor electrode region, the reference numeral 18 indicates the second semiconductor electrode region and the reference numeral 20 indicates the semiconductor probe.

Figure 9J:
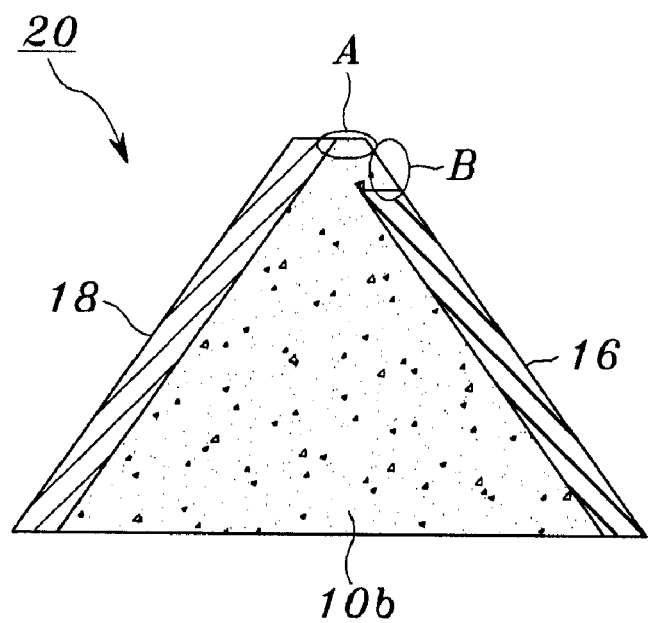

FIG. 9*j* is a schematic cross-sectional view of a tip portion of the semiconductor probe.

As illustrated in 9j, the tip of the semiconductor probe 20 includes: a body portion 10b in the shape of a pyramid and doped with a P-type or N-type impurity; a sensing zone A located at a peak of the body portion 10b; a first semiconductor electrode region 18 being formed on a first slant face of the body portion 10b in whole and doped with the first impurity at a high concentration; a second semiconductor electrode region 16 formed on a second slant face of the body portion 10b to expose the sensing zone A and a part of the slant face connected to the sensing zone A and doped with the second impurity at a high concentration; and an impact-ionization region B located at the exposed part of the second slant face of the body portion.

Here, the first impurity includes a n-type impurity and the second impurity includes a p-type impurity, so that the first semiconductor electrode region 16 includes an n+ electrode region and the second semiconductor electrode region 18 includes a p+ electrode region. To the contrary, the first impurity may include the p-type impurity and the second impurity may include the n-type impurity, so that the first semiconductor electrode region 16 may include the p+ electrode region and the second semiconductor electrode region 18 may includes the n+ electrode region.

FIGS. 10a-10g are cross-sectional views illustrating processes for forming an end of a probe with a pyramid shape in a widthwise direction. Here, since if the anisotropic etching has been already performed, it is difficult to additionally apply the anisotropic etching in an opposite direction for the purpose of forming the pyramid shape, HSQ transfer method as described herein below may be used for forming the end of the probe with the pyramid shape.

Figure 10A:
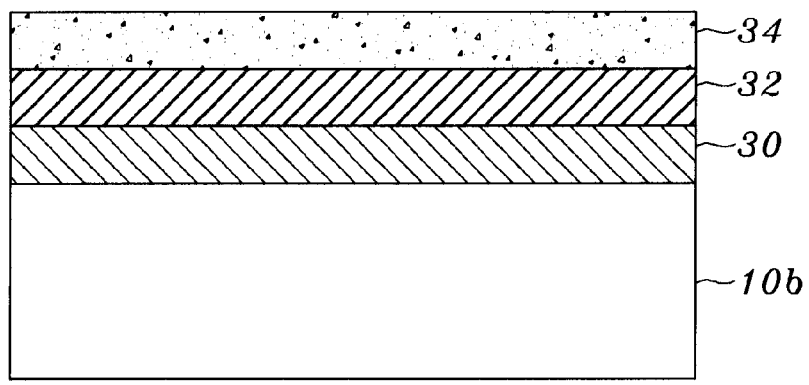
FIGS. 10a-10g are sectional views of processes for forming a pyramid-shaped probe end in a widthwise direction.

First, FIG. 10a illustrates the silicon substrate 10b, of which the semiconductor probe 20 shown in FIG. 9j is turned in one direction. As illustrated in FIG. 10a, a first etching mask layer 30, a second etching mask layer 32 and a photo-resist layer 34 are sequentially deposited on the silicon substrate 10b.

Here, a first etching mask layer 30 is preferably formed as a silicon oxide layer (SiO2) and a second silicon mask layer 32 is formed as a silicon nitride layer (TEOS). The first etching mask layer 30 and the second etching mask layer 32 are formed from materials, of which etching selection rates are different from each other.

Figure 10B:
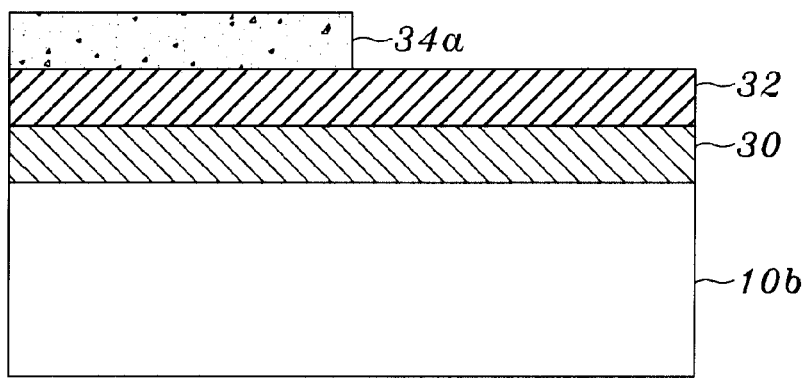

Next, as illustrated in FIG. 10b, the photo-resist layer 34 is patterned using a mask (not shown) through light exposing, developing and etching processes.

Figure 10C:
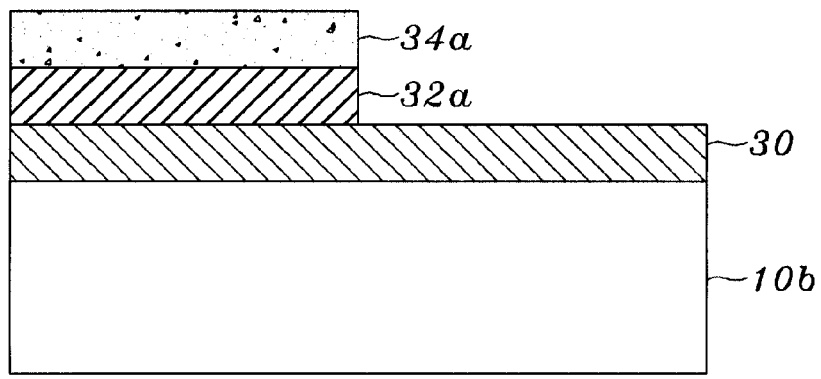

Thereafter, as illustrated in FIG. 10c, the second etching mask 32a is etched while the patterned photo-resist layer 34a is used as an etching mask through the photolithographic and the dry etching processes.

Figure 10D:
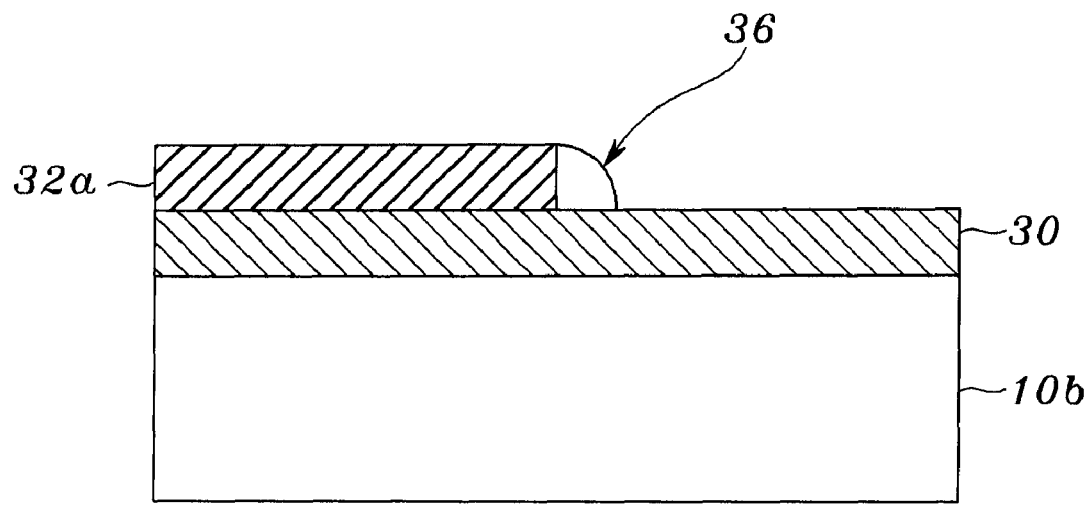

Thereafter, as illustrated in FIG. 10d, the photo-resist layer 34a is removed and then a spacer layer 36 is formed by stacking nitride material on the side wall area of the second etching mask 32a.

Figure 10E:
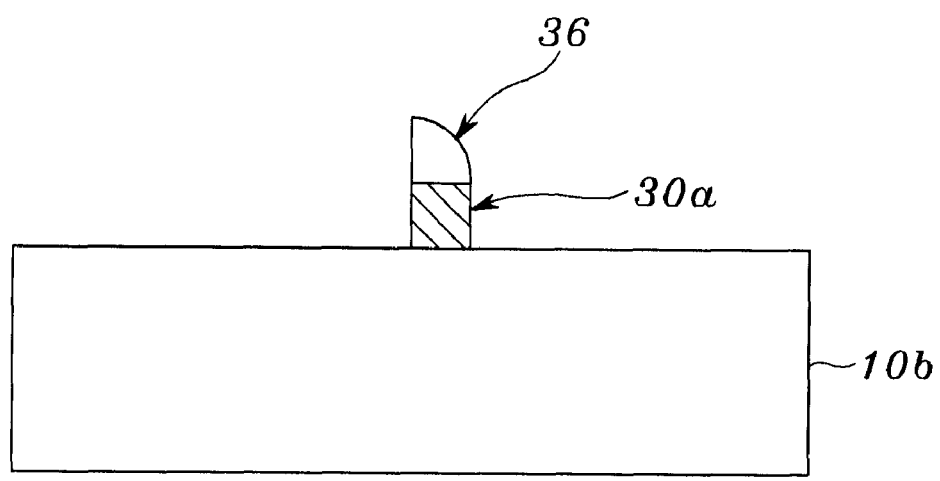

Next, as illustrated in FIG. 10e, the second etching mask 32a is removed and then the first etching mask layer 30 is etched while the spacer layer 36 is used as an etching mask. Afterward, when the spacer layer 36 is removed, the process for forming the oxide line on the silicon substrate 10b is completed.

With use of the above-described method, a pattern line width can be determined from dimensions of a film thickness and thus a line pattern with the dimension of about 10 nm may be readily formed.

Also, the above-described exemplary embodiment is related to the formation of SiO2 pattern from the space layer thickness, wherein the line pattern with the dimension ranging from about 20 nm to 30 nm may be readily formed.

Figure 10F:
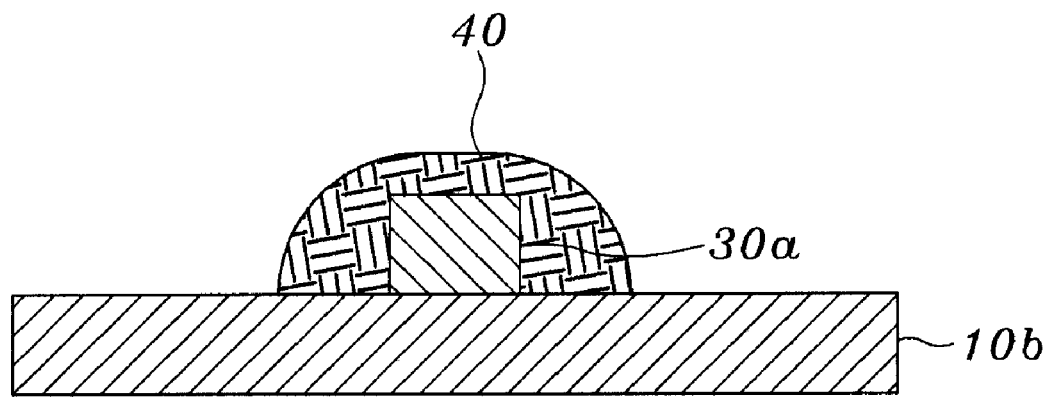

Next, as illustrated in FIG. 10f, an HSQ solution is applied over the first etching mask layer 30a to cover the same sufficiently. Afterward, spacer layers (or HSQ layer) 40 are formed at both sides of the first etching mask layer 30a and then the remaining portion is removed using a mask (not shown).

Figure 10G:
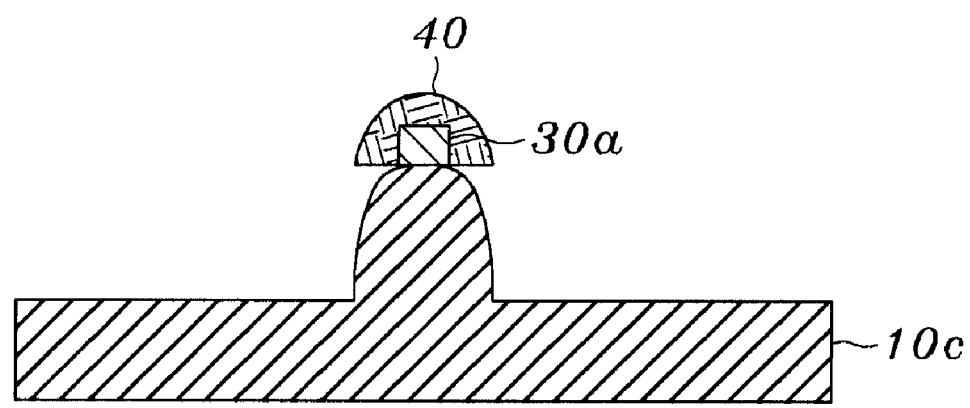

Next, as illustrated in FIG. 10g, if the etching of the silicon (Si) substrate is performed using the HSQ transfer manner, the HSQ layer 40 with a low etching rate is etched, together with the silicon substrate 10b. Accordingly, a shape with the slant faces illustrated in FIG. 10g appears.

Here, if the anisotropic etching has been already performed, it is difficult to apply the anisotropic etching in an opposite direction once again for the purpose of forming a pyramid shape. Thus, the HSQ transfer method should be used. In the present invention, the probe end with the pyramid shape is formed by HSQ transfer method.

As describe herein before, a semiconductor probe structure using impact-ionization metal oxide semiconductor device (I-MOS), an information storing device therewith and a manufacturing method thereof according to the present invention make it not only possible to significantly improve the sensitivity limit appearing in the resistive sensor of the prior art, but also possible to readily control the amount of charges that the probe can sense, by developing the novel probe structure in which I-MOS is used and a negative voltage is applied to a source portion for easily adjusting a band energy of a source.

Further, in the present invention, it is possible to manufacture the probe with a sufficient ON/OFF current ratio and thus the device sensitivity can be improved thereby.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor probe structure using an impact-ionization metal oxide semiconductor device, the method comprising:

forming a first slant face of the semiconductor probe structure by an anisotropic etching process using a first etching mask pattern formed on a silicon substrate;

forming a first semiconductor electrode region by doping impurities on an exposed portion of the silicon substrate and removing the first etching mask pattern;

forming a second etching mask pattern in an opposite direction of the first etching mask pattern on the silicon substrate;

forming a spacer layer on a side wall of the second etching mask pattern;

forming a second slant face of the probe by anisotropically etching the exposed portion of the silicon substrate and thereafter removing the spacer layer;

forming a second semiconductor electrode region by doping the impurities on the exposed portion of the silicon substrate and thereafter removing the second etching mask pattern;

forming a silicon oxide layer pattern on the silicon substrate having the second semiconductor electrode region;

forming spacer layers on both side walls of the silicon oxide layer pattern; and etching the silicon substrate to a predetermined depth by photolithographic and etching processes using the spacer layers and removing the spacer layers.

2. The method for manufacturing a semiconductor probe as claimed in claim 1, wherein:
   the first semiconductor electrode region is formed on the first slant face of the probe in whole; and
   the second semiconductor electrode region is formed on the second slant face of the probe to expose an upper portion of the second slant face.

3. The method for manufacturing a semiconductor probe as claimed in claim 1, wherein:
   the first semiconductor electrode region is formed on the first slant face of the probe to expose an upper portion of the first slant face; and
   the second semiconductor electrode region is formed on the second slant face of the probe in whole.

4. The method for manufacturing a semiconductor probe as claimed in claim 1, wherein:
   the first semiconductor electrode region is a source terminal; and
   the second semiconductor electrode region is a drain terminal.

5. The method for manufacturing a semiconductor probe as claimed in claim 4, wherein:
   a ground voltage is applied to the silicon substrate;
   a positive voltage is applied to the drain terminal and a gate terminal; and
   a negative voltage is applied to a source terminal.

6. The method for manufacturing a semiconductor probe as claimed in claim 1, wherein:
   the first semiconductor electrode region is a drain electrode; and
   the second semiconductor electrode regions is a source electrode.

7. The method for manufacturing a semiconductor probe as claimed in claim 6, wherein:
   a ground voltage is applied to the silicon substrate;
   a positive voltage is applied to the drain terminal and a gate terminal; and
   a negative voltage is applied to a source terminal.

8. The method for manufacturing a semiconductor probe as claimed in claim 1, wherein the step of forming the silicon oxide layer pattern comprises:
   depositing a third etching mask, a fourth etching mask and a photo-resist layer on the silicon substrate in sequence;
   patterning the photo-resist layer and thereafter etching the fourth etching mask layer using the photolithographic and the etching processes;
   removing the photo-resist layer and then forming a second spacer layer on a side wall of the fourth etching mask layer;
   removing the fourth etching mask layer and thereafter etching the third etching mask layer using the second spacer layer;
   removing the second spacer layer and forming a pattern of the silicon oxide layer.

9. The method for manufacturing a semiconductor probe as claimed in claim 1, wherein the spacer layer is formed by coating the third etching mask layer with an HSQ (hydrogen silsequioxane) solution.

* * * * *